United States Patent [19]

Prieur-Drevon

[11] Patent Number: 5,068,701
[45] Date of Patent: Nov. 26, 1991

[54] DEVICE FOR READING OUT QUANTITIES OF ELECTRICAL CHARGE SUPPLIED BY PHOTODIODES HAVING A SEMICONDUCTOR SUBSTRATE

[75] Inventor: Pascal Prieur-Drevon, Gieres, France

[73] Assignee: Thomson-CSF, Puteaux, France

[21] Appl. No.: 326,516

[22] Filed: Mar. 21, 1989

[30] Foreign Application Priority Data

Mar. 23, 1988 [FR] France ................. 88 03792

[51] Int. Cl.$^5$ ............................................. H01L 29/78
[52] U.S. Cl. ........................................ 357/24; 377/57; 377/63; 358/213.19; 358/213.23
[58] Field of Search ............... 357/24, 24 LR; 377/57, 377/63, 60, 61, 62, 57, 63; 358/213.19, 213.23

[56] References Cited

U.S. PATENT DOCUMENTS

| | | | |
|---|---|---|---|
| 3,969,634 | 7/1976 | Su et al. | 357/24 |
| 4,236,830 | 12/1980 | Schlig | 357/24 |
| 4,242,599 | 12/1980 | Suzuki | 357/24 |
| 4,336,557 | 6/1982 | Koch | 358/213 |
| 4,694,316 | 9/1987 | Chabbal | 357/24 |
| 4,695,889 | 9/1987 | Portmann | 357/24 |
| 4,716,466 | 12/1987 | Miida et al. | 357/24 LR |
| 4,810,901 | 3/1989 | Yamada | 357/24 LR |
| 4,884,142 | 11/1989 | Suzuki | 357/24 LR |

*Primary Examiner*—Rolf Hille
*Assistant Examiner*—Steven Loke
*Attorney, Agent, or Firm*—Oblon, Spivak, McClelland, Maier & Neustadt

[57] ABSTRACT

The invention concerns a device for reading quantities of electrical charge supplied by photodiodes. These photodiodes (1) are arranged at the intersections of rows and columns (4,5) of a matrix (area) array. The device consists of means (6) for storing charges coming from a row of column of the array during scanning, a shift register (10) having an input stage and n-1 intermediate stages, means (18, 20) for injecting bias charges into the receiving potential wells, and skimming type transfer means (19) for transferring the stored charges and bias charges towards the shift register. The readout during scanning of the charges form a row or column of photodiodes is obtained after n charge transfers and n-1 shift operations. With known devices, n readouts are carried out per row or column, making them very slow and/or inefficient with large or high-signal photodiodes.

5 Claims, 3 Drawing Sheets

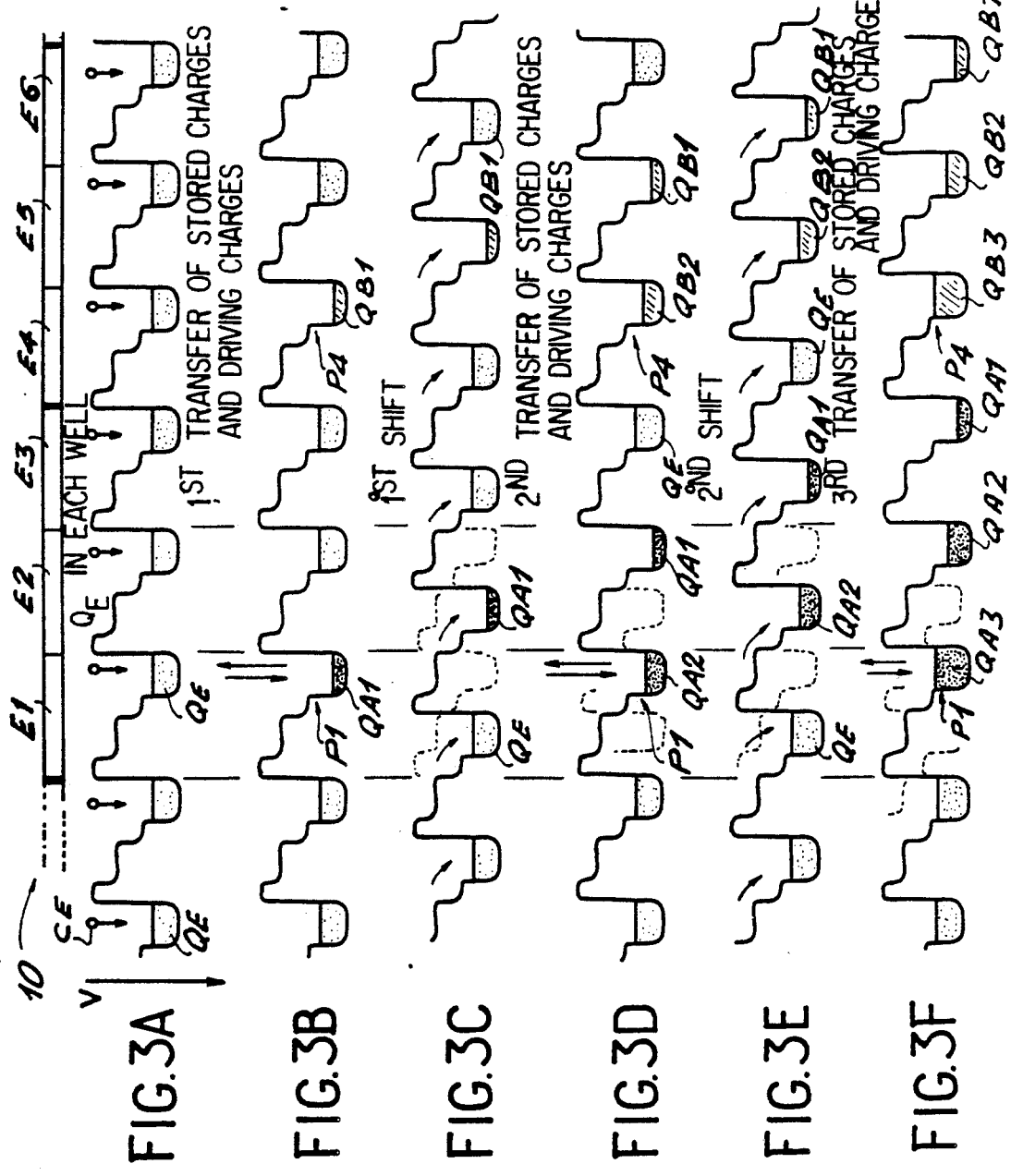

DEVICE FOR READING OUT QUANTITIES OF ELECTRICAL CHARGE SUPPLIED BY PHOTODIODES HAVING A SEMICONDUCTOR SUBSTRATE

FIELD OF THE INVENTION

The present invention generally concerns a device for reading out quantities of electrical charge supplied by photodiodes having a semiconductor substrate and operating in a capacitive storage mode.

The invention more specifically applies to matrix arrays (also known as area arrays) of photodiodes in which these photodiodes are located at the intersections of rows and columns and can have a high capacitance.

DESCRIPTION OF PRIOR ART

Devices for reading out quantities of electrical charge supplied by photodiodes disposed in area arrays or linear arrays are known in prior art. Such devices have storage means that create charge storage potential wells in the photodiode substrate. These potential wells correspond to each respective row or column of the array to store, by row or column, the successive charges coming from each respective row or column of photodiodes.

These storage means are in fact comparable to a parallel-input buffer register, and allow the successive storage of charges coming from the photodiodes of each row or column as a result of scanning the matrix array by row or column. These known devices also possess a charge-coupled device (CCD) analog shift register with parallel inputs and serial output.

The shift register, which has a semiconductor substrate, has control means for creating potential wells and transfer potentials in the substrate, for conveying electrical charges in the latter. These control means essentially consist of electrodes (also referred to as gates) to which are applied control voltages that create transfer potential wells, usually in relation to different doped or implanted zones of different types in the substrate. These transfer potentials enable the charges received by the registers to be shifted from well to well towards one end of the register that is coupled to readout means. This end can consist of a semiconductor charge-storage diode connected to an amplifier, itself connected to a measuring device or a processing circuit.

Finally, these known devices contain charge transfer means having a semiconductor substrate (e.g. a MOS transistor), for each charge storage means. These charge transfer means form the shift register's lateral input and serve to transfer charges from a storage potential well to a receiving potential well that is common to both the transfer means and the shift register. The thus-transferred charges are then succesively shifted toward one end of the shift register. When the quantity of stored charge is weak, or when the stored charges are of opposite polarity to the charges the register can convey, it is common practice to employ "skimming" transfer means to ensure efficient transfer. These skimming transfer means are usually coupled to means for injecting bias charges into the receiving wells, which are common to the transfer means and the shift register. Such injection means are known in the prior art. The bias charges are created either by voltages applied to electrodes lying on the transfer means' substrate, or by luminous radiation applied to semiconductor diodes close to the transfer means. When the bias charges have been injected into the receiving potential wells, the voltages applied to the electrodes—or device controlling the transfer means—cause the bias charges to be transferred from each receiving potential well to a corresponding storage well, by means of the transfer potentials in the substrate, and then inversely cause the stored charges and the bias charges to be transferred to the receiving well. The resulting algebraic sum of the storage and bias charges are conveyed by successive shifts to one end of the readout register.

However, the above-described skimming transfer mechanism lacks in speed and efficiency in some cases.

It is known that when the capacitance of the charge storage means (photodiodes) is high, it takes some time for the stored charge transfer means to become effective, unless a large bias charge is used, calling for an oversized shift register (CCD). This slowness in charge transfer into the shift register by the charge transfer means is all the greater when the stored charges have the opposite sign to that of the charges transferred by the shift register, since in that case the stored charges are subtracted from the bias charge and the resultant charge cannot then be transferred with good efficiency.

One known solution for when the stored charge—irrespective of its sign—cannot be fully transferred in one operation consists in dividing it and transferring it over several operations in view of accumulating the different fractions at the readout end of the shift register. (This method is termed "line accumulation".)

In the present state of the art, for each row or column, and after each transfer of the stored charges and bias charges into the receiving wells of the shift register, the thus-accumulated charges are shifted in succession towards the shift register's readout end, where the different values of their measured charge are stored. The register then being empty, there is performed another transfer of the stored charges and bias charges towards the shift register's receiving wells, for the same row or column. These added charges are again shifted towards the end of the shift register so that the values of their measured charge can again be stored, after being added to the previous stored values for the diodes corresponding to the row or column in question.

One of the drawbacks with that kind device is that it requires a row or column memory outside the shift register for summing the measured charge values for each diode, making the device expensive.

A much more severe drawback stems from the fact that, for the row or column diodes, the entire contents of the shift register have to be emptied after each transfer to the receiving potential wells. This requires a large number of shift operations during which time each photodiode in a row or column continues to accumulate charges. If it takes too long to empty the shift register, then not all the accumulated charges can be measured, and the photodiodes saturate. There then occurs a blooming effect, which severly deteriorates the quality of the image produced by the area array sensor.

AIM OF THE INVENTION

The aim of the invention is to overcome these drawbacks and more specifically to produce a device for efficiently reading out quantities of electrical charge delivered by an area array of photodiodes which obviates the need to completely empty the shift register several times and store and sum the measured charges after each readout. The inventive device prevents saturation of the photodiodes and allows a considerable increase in the row or column scanning speed for a signal level that can be equal to, or even higher than that which can be transported by the shift register.

SUMMARY OF THE INVENTION

The subject of the invention is a device for reading out quantities of electrical charge supplied by photodiodes having a semiconductor substrate and located at the intersections of rows and columns in a matrix array, comprising: an assembly, storage means for creating storage potential wells in the substrate, said storage potential wells each corresponding to a respective row or column and serving to store, row by row or column by column, the successive charges coming from the photodiodes of each row or each column respectively, a chargecoupled device shift register having a semiconductor substrate and control means for creating potential wells and transfer potentials in said shift register's substrate to convey electrical charges inside said register up to an output end of said register, said end being coupled to means for reading out quantities of charge, and charge transfer means having a semiconductor substrate, said charge transfer means having control means for creating in said substrate transfer potentials and a receiving potential well for receiving charges contained in the corresponding storage potential wells, said receiving potential wells of said transfer means corresponding to the different storage potential wells that are also the potential wells of said shift register, and means for injecting bias charges into said receiving potential wells, the control means of each transfer means causing the transfer of said bias charges, contained in the receiving potential well of said transfer means, to the corresponding potential well, and then the transfer of said bias charges and at least a part of said stored charges to the receiving potential well. The said charge transfer means (lateral input) is characterized in that the shift register has n successive stages for each photodiode, n-1 of these stages forming intermediate potential wells between, on the one hand, the receiving potential well corresponding to a given photodiode and its neighboring photodiode for the same row or column, and on the other, a stage common to both the shift register and said transfer means corresponding to said photodiode, said common stage creating the said receiving potential well, the quantity of charge contained in each storage potential well being accounted for by said shift register after n transfers of stored charges and bias charges towards the shift register and n-1 shift operations, the charge injection means injecting bias charges into all of the shift register's receiving potential wells before each transfer of charge into said receiving potential wells, the quantity of charge to be read out for each photodiode being read after n transfers of stored charge.

According to another characteristic of the invention, the bias charge injection means are parallel bias charge transfer means that inject equal quantities of bias charge into the respective receiving potential wells before each transfer of these bias charges towards the corresponding storage potential well.

According to another characteristic of the invention, the bias charge injection means are transfer means that inject bias charges at the end of said shift register opposite to the readout end so that, by successive shift operations, all of the shift register's potential wells each receive equal quantities of bias charge before the first transfer of bias charge towards the storage potential well, a new quantity of bias charge being injected at the input end at each subsequent charge transfer from a storage well to a receiving well.

According to another characteristic of the invention, the photodiodes and storage means are of p-type semiconductor on an n-type semiconductor substrate, and the shift registers have a p-type semiconductor substrate.

According to another characteristic of the invention, the photodiodes and storage means are of n-type semiconductor on an p-type semiconductor substrate, and the shift registers have a p-type semiconductor substrate.

DESCRIPTION OF THE DRAWING

The characteristics and advantages of the invention shall be made clearer from the following description with reference to the appended figures, wherein:

FIGS. 3A, 3B, 3C, 3D, 3E, and 3F are diagrams showing the potential wells and transfer potentials that act in the shift register of a device according to the invention.

DESCRIPTION OF THE PREFERRED EMBODIMENTS

Figure 1:
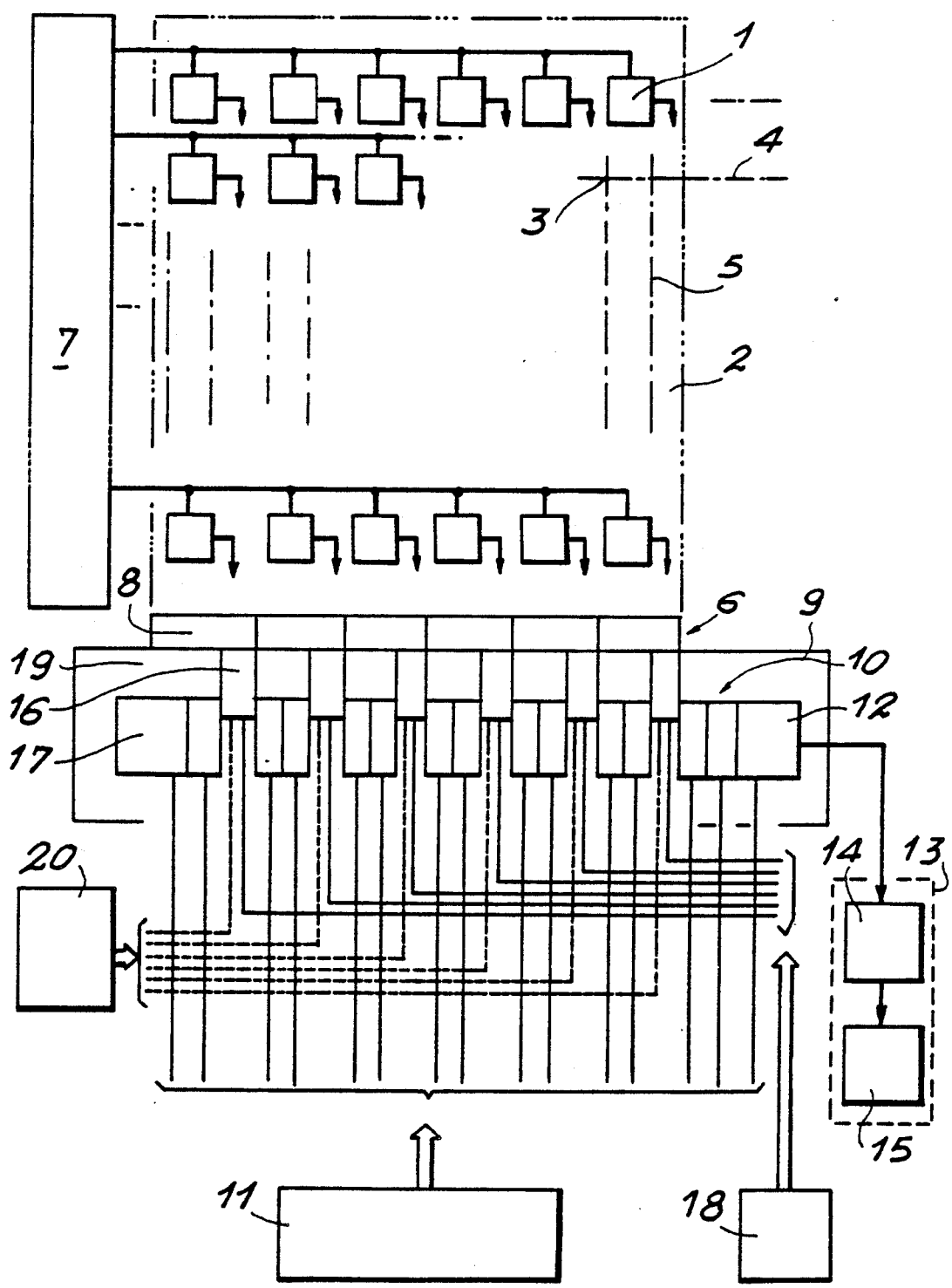
FIG. 1 is a schematic diagram of a device according to the invention, for reading out quantities of electrical charge supplied by photodiodes.

The inventive device shown schematically in FIG. 1 allows the readout of electrical charges supplied by photodiodes 1 having a semiconductor substrate 2. These photodiodes 1 are located at the intersections of rows 4 and columns 5 so as to form a matrix, or area array.

The device also has a series 6 of charge storage means 8 that create—as will be detailed later—storage potential wells corresponding to each respective row or column. These storage means allow row-by-row or column-by-column storage of successive charges from each row or column of photodiodes in the array. In the embodiment of FIG. 1, it will be assumed that the photodiode array is scanned row-by-row (row scanning). The scanning means are known in the prior art and bear the figure reference 7. Each storage means 8 of the series 6 can thus store the charges from each row of photodiodes, these rows being scanned in succession. Each storage means 8 can be formed of an electrode opposite its corresponding column and lying on an insulating layer covering the substrate 2. A voltage can then be applied to this electrode to create a storage potential well in the substrate opposite the electrode (not shown).

The device also has a charge-coupled device (CCD) shift register 10 with a semiconductor substrate 9. This shift register has control means, formed by a voltage source 11, that apply in a known manner voltages for creating potential wells and transfer potentials in the substrate 9 via electrodes (not shown) resting on an insulating layer covering the substrate. These transfer potentials and potential wells convey electrical charges along the register towards an output end 12 that is coupled to means 13 for reading out quantities of charge arriving at said output end 12. The output end 12 may, for example, be formed of a final electrode (not shown) lying on an insulating layer covering the substrate 9. A voltage can then be applied to this final electrode to create a final potential well in the substrate, into which arrive the charges shifted along the shift register 10.

The readout means 13 comprise, as in known in the art, an amplifier 14 connected to a measuring electrode (not shown) that lies on an insulating layer covering the substrate in the region of the register's output end 12. An amplifier output delivers a current or voltage that is measured by a readout device 15 capable of recording said charges. For each charge storage means 8, the device also has a charge transfer means 16 with a semiconductor substrate 9. This transfer means 16, which is known in the art, is fitted with control means such as electrodes (not shown) lying on an insulating layer covering the substrate 9 and to which are applied control voltages supplied from a voltage source 18. The control means 19 for the transfer means create—as shall be detailed later—transfer potential barriers and receiving potential wells in the substrate 9, corresponding to the respective storage potential wells of said storage means 6. As will be explained later, these receiving potential wells are also potential wells belonging to the shift register 10. They serve to transfer to the shift register 10 charges stored in the storage means and originating from a row of photodiodes, for the present embodiment of a row-scanned device.

Finally, a first embodiment of the invention the device contains bias charge injection means 17 located at an input end of the shift register 10. These charge injection means can be formed in a known manner by an electrode (not shown) lying on an insulating layer covering the substrate 9, on which is applied a voltage that creates bias charges in the substrate.

As will be explained further in detail, the bias charges injected at the shift register input travel along the shift register in successive shift operations up to the register's output end. These bias charges are injected into the receiving potential wells in equal quantities at each shift operation.

In another embodiment of the invention, the bias charge injection means are parallel transfer means 20—known in prior art—that inject equal quantities of bias charge into the respective shift register receiving wells after each shift operation.

As will be explained further in detail, the means controlling each transfer means cause the transfer of the bias charges contained in each receiving well of the transfer means to the corresponding storage wells, and, inversely, the transfer to the receiving potential wells of the bias charges and at least a part of the charges stored in the storage potential wells corresponding to the respective receiving potential wells. This two-way transfer is achieved thanks to the transfer potential barriers created in the substrate 9 by the above-described means. These can be formed of a voltage-controlled MOS transistor. Such a two-way transfer procedure is known under the term "skimming".

FIGS. 2A to 2E help better understand how the charge transfer means operate and, in particular, how the skimming procedure is carried out in the inventive device. FIGS. 2A to 2E are diagrams of the potential wells and transfer potentials that appear in the substrate 2 of a charge storage means 8 and in the substrate 9 of a corresponding charge transfer means 16.

Figure 2A:
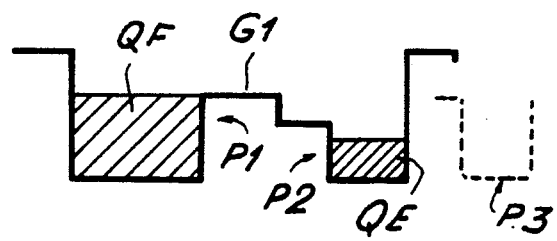
FIGS. 2A to 2E are schematic diagrams of the potential wells and transfer potentials that act in charge storage and transfer means of a device according the invention.
Figure 2B:
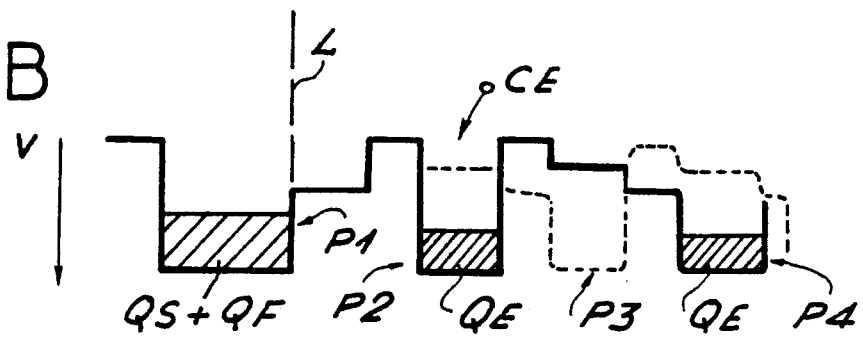

FIGS. 2A and 2B show a storage potential well P1 in the said charge storage means 8, a receiving potential P2 that is common to both said transfer means 16 and said shift register 10, and potential wells, such as P3, in the shift register.

The potentials increase in the substrate along the direction of the arrow V. The broken line L marks the separation between the substrate for both the storage means and the photodiodes, and the substrate for transfer means and the shift register. Diagram 2A shows schematically a quantity of charge Qs contained in a storage means' storage well P1, said charge coming from a row photodiode, for example, and having been transferred into said well during a scanning operation.

Prior to the transfer of the photodiode charges Qs into said well P1, the latter contains a fixed quantity of charge QF determined by a voltage level on gate G1 at the time of the last skimming operation (FIG. 2A). The well P1 subsequently contains a charge QF+QS (FIG. 2B). The transfer mean's potential well P2—which is also one of the shift register's potential wells—contains a portion QE of the bias charges CE injected into said well either by successive shift operations starting from one end of the shift register, or by lateral injection, as explained above.

For reasons which shall be detailed later, the shift register's potential well P4 also contains a quantity of charge QE, which is unavoidable in the case of an injection of charge QE from an end of the shift register.

Figure 2C:
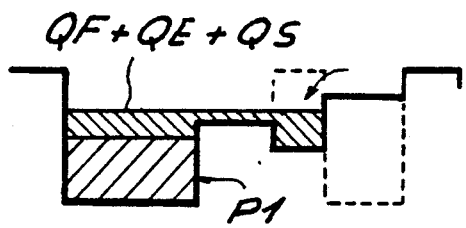

FIG. 2C shows the next stage in the charge transfer process. The voltages applied to the charge transfer means' electrodes 8 are such as to make the transfer potential in the substrate 9 differ in a manner such that the bias charges CE contained in the receiving well P2 are transferred into the storage wells P1 where they combine with the charges already stored in that well and coming from the corresponding photodiode. This transfer enables the storage and bias charges to be combined, producing a charge quantity QE+QS. If the photodiodes and charge storage means have p-type zones in an n-type semiconductor substrate, and the shift register has a p-type substrate, then the charges supplied by the photodiodes and contained in the storage potential wells are positive, whereas the charges in the shift register's potential wells are electrons (this is the case for FIG. 2). In this case the quantity of charge QE injected into the shift register's potential wells should be larger in magnitude than the quantity of stored charge Qs to be transferred.

Conversely, when the photodiodes and charge storage means have n-type zones in a p-type substrate, and the shift register also has a p-type substrate, then the stored and bias charges are both electrons and the only limitation then is the maximum quantity of charge that can be contained in the shift register potential wells.

Figure 2D:
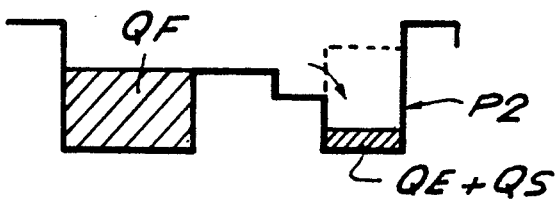

FIG. 2D shows schematically the following stage in the transfer of charge to the shift register, and more precisely to the receiving potential well P2 common to the transfer means in question and the shift register. The control means for the transfer means create transfer potentials in the substrate so as to cause a flow of a charge quantity QE+Qs towards potential well P2.

Figure 2E:
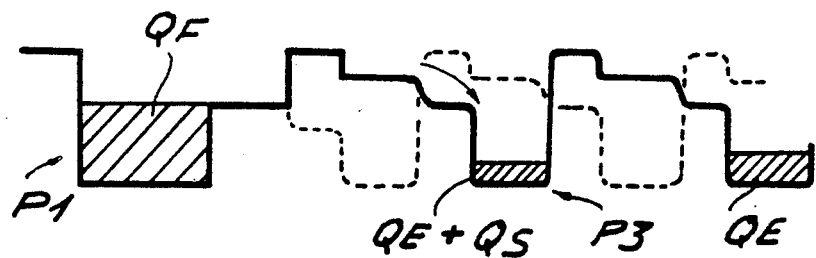

Then, as shown schematically in FIG. 2E, a shift operation is carried out by the shift register's transfer potentials via the control means. The charge quantity QE+Qs is transferred into the shift register's potential well P3 while a bias charge QE is injected into receiving potential well P1.

The entire process then reiterated to transfer a new quantity of stored charge. The number of transfers thus carried out for each photodiode is determined by the quantity of stored charge, i.e. by the photodiode characteristics and the maximum illumination to be applied to the area array. This number of transfer in fact corresponds to the pitch, or number of shift register stages, between two consecutive photodiodes in a row or column, depending on the type of scanning used.

FIGS. 3A to 3F shall help better understand the operation of the device, and more specifically the structure of the shift register. These figures are diagrams showing the potential wells and transfer potentials V in the shift register substrate at different moments.

FIG. 3A shows the shift register potential wells before transfer of the charges stored for each row or column photodiode into the shift register's respective receiving potential wells. Each of the register's potential wells contains a portion QE of the bias charge CE that is either injected laterally or at one end of the shift register and successively shifted (towards the right in the figure). FIG. 3 shows schematically the successive stages E1, E2, E3, ..., E6 in the shift register 10. Stages E1, E2 and E3 correspond to a photodiode in a given row and column. Stages E4, E5 and E6 correspond to a photodiode in the same row but in the next column. Only stages E1 and E4 among those shown are common to both the shift register and transfer means 19.

FIG. 3B shows the shift register contents after a first transfer of bias charges and stored charges into potential wells P1 and P4, which are common to said transfer means and shift register stages E1 and E4. After this first transfer, potential well P1 contains a charge quantity QA1=QE+QS1, say, where charge QS1 comes from one of the photodiodes in a given row and column. Similarly, another receiving potential well P4 corresponding to another photodiode from the same row but the next column of the array contains a charge quantity QB1 =QE+QS2.

FIG. 3C shows the shift register contents after a first shift towards the right of charges QA1 and QA2 previously contained in the receiving potential wells of each corresponding photodiode. Charges QA1 and QB1, which are to be measured, and which were previously contained in shift register stages E1 and E4, are now contained in shift register stages E2 and E5 respectively. The receiving potential wells of stages E1 and E4 receive new quantities of bias charge QE by means of either a shift operation in their respective preceding stages (as in the example shown in the figure) or by lateral injection.

FIG. 3D shows the shift register contents after a second transfer of bias charges QE and stored charges QS'1 and QS'2 into receiving potential wells P1 and P4. After this second transfer, receiving potential wells P1 and P4 of stages E1 and E4 respectively contain charge quantities QA2=QE+QS'1 and QB2=QE+QS'2.

FIG. 3E shows the shift register contents after a second shift towards the right. Charge quantities QA2 and QB2, which were previously contained in shift register stages E1 and E4 respectively, have now passed into shift register stages E2 and E5 respectively. Charge quantities QA1 and QB1, which were respectively contained in shift register stages E2 and E5, have now passed into shift register stages E3 and E6.

The receiving potential wells of shift register stages E1 and E4 once more receive quantities of bias charge QE, either by a shift operation from the preceding stage or by lateral injection.

FIG. 3F shows the shift register contents after a third transfer of bias charge and charges QS"1 and QS"2 previously stored in the storage wells of said storage means. After this third transfer, receiving potential wells P1 and P4 of shift register stages E1 and E4 contain charge quantities QA3=QE+QS"1 and QB3=QE+QS"2, respectively. All of the shift register's potential wells are hence occupied by the charges thus transferred for each photodiode from the corresponding storage means, after three transfers and two shift operations. It will naturally be assumed that three transfers are sufficient for each diode to transfer to the shift register all the charges it has accumulated during a line scanning period. This number of transfers and its associated number of shift operations shall clearly depend on the photodiode characteristics, the maximum illumination on the area array, and the line scanning period. Once all the shift register potential wells are occupied by the charges progressively transferred from a given row of photodiodes, the quantities of charge contained in the shift register potential wells are read out, recorded and accumulated by readout means after each successive charge shift operation towards the register's readout end. Since the number of potential wells corresponding to the charges to be measured is known, it is straightforward to measure charges such as QA1+QA2+QA3 accumulated for each diode, using the readout means. It then becomes no longer necessary to completely empty the shift register after each charge transfer, and several times for each row, as is the case with prior art practice.

In fact, in the described embodiment, the shift register has two successive stages, such as E2 and E3 for each diode, in order to create intermediate potential wells between receiving potential wells P1 and P4 respectively corresponding to the diode in question and its neighbor in a given row. The quantity of charge contained in each storage potential well corresponding to a given diode is accounted for after three transfers and two shift operations. More generally, if it takes n transfers to account for the stored charges of a photodiode, then the shift register shall have n successive stages. n-1 of these stages create n-1 potential wells between the receiving potential well for a given photodiode and that for its neighboring photodiode, and there is an extra stage common to the shift register and the transfer means. This common stage creates the receiving potential well for a given photodiode. The readout of the shift register contents for a row or column can be carried out after n charge transfers towards the register and n-1 shift operations. These successive charge transfers occur during a single scanning period, increasing the speed of the inventive device and thus avoiding photodiode saturation and the above-mentioned blooming phenomenon.

What is claimed is:

1. A device for reading out quantities of electrical charge supplied by photodiodes (1) having a semiconductor substrate and located at the intersections of rows and columns (4,5) in a matrix array, comprising an assembly (6), storage means (8) for creating storage potential wells in the substrate (2), each said storage potential well corresponding to a respective row or column and serving to store successively, row by row or column by column, charges coming from the respective photodiodes of each row or each column, a charge-coupled device shift register (10) having a semiconductor substrate (9) as well as control means for creating potential wells and transfer potentials in said shift register's substrate to convey electrical charges inside said register up to an output end (12) of said shift register, said end being coupled to means (13) for reading out quantities of charge, and, for each storage means (8), charge transfer means (16) having a semiconductor substrate (9), said charge transfer means having control means (18) for creating, in said substrate, transfer potentials and a receiving potential well for receiving charges contained in the corresponding storage potential well, said receiving potential wells of said transfer means (16) corresponding to the different storage potential wells that are also the potential wells of said shift register (10), and means (20) for injecting bias charges into said receiving potential wells, said control means of each transfer means (16) causing the transfer of bias charges contained in the receiving potential well of said transfer means to the corresponding storage potential well, and then the transfer of said bias charges and at least a part of said stored charges into the receiving potential well, characterized in that said shift register (10) has n successive stages for each photodiode (1), n-1 of these stages forming n-1 intermediate potential wells between, on the one hand, said receiving potential well corresponding to said photodiode and its neighboring photodiode in the same row or column, and on the other, a stage common to both the shift register (10) and said transfer means (16) corresponding to said photodiode and creating the said receiving potential well, the quantity of charge contained in each storage potential well being accounted for by said shift register (10) after n transfers of stored charges and bias charges towards said shift register, and n-1 shift operations, said charge injection means injecting bias charges into all of said shift register's receiving potential wells before each transfer of charge into said receiving potential wells, the quantity of charge to be read out for each photodiode being read after n transfers of stored charge.

2. Device according to claim 1, characterized in that said bias charge injection means (20) are parallel bias charge transfer means that inject equal quantities of bias charge into the respective receiving potential wells before each transfer of these bias charges towards the corresponding storage potential well.

3. Device according to claim 1, characterized in that said bias charge injection means are transfer means (17) that inject bias charges at one end of said shift register, said end being opposite to the readout end (12), so that by successive shift operations all the shift register's potential wells respectively contain equal quantities of bias charge before the first transfer of bias charges towards said storage potential wells, an extra quantity of bias charge being injected at the input end after each subsequent charge transfer from a storage well to a receiving well.

4. Device according to claim 1, characterized in that said photodiodes and storage means are of p-type semiconductor on an n-type semiconductor substrate (2), and said shift register has a p-type semiconductor substrate (9).

5. Device according to claim 1, characterized in that said photodiodes and storage means are of n-type semiconductor on an p-type semiconductor substrate, and said shift register has a p-type semiconductor substrate (9).

* * * * *